United States Patent
Lai et al.

(10) Patent No.: US 8,520,161 B2
(45) Date of Patent: Aug. 27, 2013

(54) DISPLAY DEVICE WITH BENDED SIGNAL TRANSMISSION STRUCTURE AND METHOD FOR MANUFACTURE THEREOF

(75) Inventors: Jui-Lin Lai, Hsin-Chu (TW); Che-Chih Chang, Hsin-Chu (TW); Chih-Chung Chao, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 626 days.

(21) Appl. No.: 12/205,336

(22) Filed: Sep. 5, 2008

(65) Prior Publication Data

US 2009/0067124 A1 Mar. 12, 2009

(30) Foreign Application Priority Data

Sep. 7, 2007 (TW) ................................ 96133493 A

(51) Int. Cl.
*G02F 1/1333* (2006.01)
*G02F 1/1345* (2006.01)

(52) U.S. Cl.
USPC ................................ 349/58; 349/56; 349/150

(58) Field of Classification Search
USPC ................................ 349/56, 58, 150
See application file for complete search history.

(56) References Cited

U.S. PATENT DOCUMENTS

| | | | |
|---|---|---|---|
| 7,885,695 B2 * | 2/2011 | Kauhaniemi et al. | 455/575.4 |
| 2004/0012531 A1 * | 1/2004 | Toda | 343/702 |
| 2005/0068486 A1 * | 3/2005 | Ono | 349/150 |
| 2006/0119761 A1 | 6/2006 | Okuda | |
| 2006/0264093 A1 | 11/2006 | Shim | |

FOREIGN PATENT DOCUMENTS

| | | |
|---|---|---|
| CN | 1499245 | 5/2004 |
| CN | 2763845 | 3/2006 |
| CN | 1811543 | 8/2006 |
| CN | 1869776 | 11/2006 |
| TW | 563089 | 11/2003 |
| TW | 00563089 | 11/2003 |
| TW | I220510 | 8/2004 |
| TW | I224709 | 12/2004 |
| TW | 200727040 | 7/2007 |
| WO | WO 2006067259 A1 * | 6/2006 |

OTHER PUBLICATIONS

English language translation of pertinent parts of CN 1811543.
English language translation of pertinent parts of CN 1499245.

(Continued)

*Primary Examiner* — Eric Wong
*Assistant Examiner* — Mary El Shammaa
(74) *Attorney, Agent, or Firm* — McClure, Qualey & Rodack, LLP

(57) ABSTRACT

This invention provides a display device and the assembly method thereof. The display device includes a first electronic module and a second electronic module partly overlapping each other. The first electronic module includes a first signal transmission unit with one side extending to form a first extension section. The second electronic module includes a second signal transmission unit partly overlapping the first signal transmission unit and having a side extending to form a first connection section. The first extension section overlaps and is electrically connected to the first connection section. Part of the overlapping first extension section and first connection section are bent to partly overlap the second signal transmission unit. Thus the second signal transmission unit is able to accept and to transmit signals via the first signal transmission unit of the first electronic device.

30 Claims, 17 Drawing Sheets

(56) References Cited

OTHER PUBLICATIONS

English translation of abstract and relevant portions of TW 200727040.
English translation of abstract and relevant portions of TW 563089.
English language translation of abstract of TW I224709, Dec. 2004.
English language translation of abstract of TW I220510, Aug. 2003.
English language translation of abstract of TW 00563089, Nov. 2003.
Chinese language office action dated Sep. 5, 2008.
English language translation of pertinent parts of CN 1811543, Aug. 2006.
English language translation of pertinent parts of CN 1499245, May 2004.
English translation of abstract and relevant portions of TW 200727040, Jul. 2007.
English translation of abstract and relevant portions of TW 563089, Nov. 2003.
Taiwan Office Action dated Jul. 27, 2010.

* cited by examiner

DISPLAY DEVICE WITH BENDED SIGNAL TRANSMISSION STRUCTURE AND METHOD FOR MANUFACTURE THEREOF

BACKGROUND OF THE INVENTION

1. Field of the Invention

This present invention relates to a display device and the assembly method thereof. Specifically, the present invention relates to a LCD (Liquid Crystal Display) device and the assembly method thereof.

2. Description of the Prior Art

The display devices using display panels are gradually becoming the mainstream in the field of display devices. For instance, various display screens, household flat screen televisions, flat screen monitors of personal computers and laptop computers, display screens of cellular phones and display cameras are products which use display panels as part of the essential components. As the display panel industry matures and develops its technology, the reduction in production cost and simplification in production procedures have become two important topics in the display panel industry.

Out of various display panels, the LCD (Liquid Crystal Display) panel is one of the most popular choices to be applied in display device. FIG. 1 illustrates a perspective view of a conventional LCD panel. As FIG. 1 shows, the conventional LCD panel includes a panel cell 11, a backlight module 20, a back cover 53 and a front frame 51. One end of the panel cell 11 is connected to a flexible circuit board 13 for transmitting signals to the panel cell 11. The backlight module 20 is disposed beneath the panel cell 11 and includes a LED (Light Emitted Diode) light source module 21 and a light guide plate 22. The LED light source module 21 emits light to pass through the light guide plate 22 and then into the panel cell 11. The LED light source module 21 uses a T-shape flexible circuit board as base plate 23. The base plate 23 is used to accept external signals and transmit those signals to the LED light source module 21 for light emission. Generally, one end of the base plate 23 is coupled with the flexible circuit board 13 of the panel cell 11 and accepts signals from external signal source via the flexible circuit board 13 of the panel cell 11. The above-mentioned assembly method integrates the signal lines of the panel cell 11 and backlight module 20 and further reduce the dimension of the overall product.

However, the base plate 23 of the LED light source module 21 of the present design includes flexible circuit board having a T-shape. Thus an original flexible circuit board needs to be cut into a T-Shape during the manufacture process. However, the geometrical characteristics of a T-Shape will prevent compact arrangement of the base plate 23. Thus waste of material will be created during the flexible circuit board cutting process which increases the overall production cost.

SUMMARY OF THE INVENTION

It is an objective of the present invention to provide a display device having a lower production cost.

It is another objective of the present invention to provide a display device having a simplified production process.

It is another objective of the present invention to provide an assembly method of display device to reduce production costs.

The display device includes a first electronic module and a second electronic module; the first electronic module partly overlaps the second electronic module. The first electronic module includes a first signal transmission unit. The first signal transmission unit extends outwards from the first electronic module and is provided to connect to external signal sources in order to transmit signals from the external signal sources to the first electronic module. One side of the first signal transmission unit extends to form the first extension section. The extending direction of the first extension section can be perpendicular to or in parallel with the extending direction of the first signal transmission unit.

The second electronic module includes a second signal transmission unit provided to connect to external devices in order to input signals into the second electronic module or to output signals from the second electronic module. One side of the second signal transmission unit extends to form a first connection section. The extending direction of the first connection section is parallel to the extending direction of the first signal transmission unit.

The first electronic module at least partly overlap the top of the second electronic module, and the first signal transmission unit at least partly overlaps the second signal transmission unit. The first extension section and the first connection section overlap and the contact points on the first extension section and the first connection section establish an electrical coupling. The electrical coupling between the first connection section and the first extension section allows the signals from signal sources for controlling the second electronic module to be transmitted from the first signal transmission device to the first extension section, and then from the first connection section to the second electronic module. Signals from the second electronic module can also be transmitted through the above-mentioned path to the external devices.

The first extension section and the first connection section establish an electrical coupling and partly bend to partly overlap the second signal transmission unit. Part of the bent first extension section and part of the bent first connection section can be disposed on the top or at the bottom of the first electronic module and can also be accommodated below the coverage of the first electronic module.

The assembly method of display device includes firstly superimposing the first electronic module on the second electronic module. Thus the first signal transmission unit of the first electronic module partly overlaps the second signal transmission unit of the second electronic module; superimposing the first extension section of the first signal transmission unit on the first connection section of the second signal transmission unit; coupling the first extension section electrically with the first connection section and bending the first extension section and the first connection section to partly overlap the second signal transmission unit.

BRIEF DESCRIPTION OF THE DRAWINGS

FIG. 4b illustrates a cross-section view of the embodiment illustrated in FIG. 4a;

FIG. 5b illustrates the cross-section view of the embodiment illustrated in FIG. 5a;

FIG. 10b illustrates the cross-section view of the embodiment illustrated in FIG. 10a;

DETAILED DESCRIPTION OF THE INVENTION

The present invention provides a display device and the manufacture method thereof. In more preferred embodiments, the display device of the present invention includes a LCD (Liquid Crystal Display) device. The LCD device generally includes the display device using the liquid crystal panel which includes household liquid crystal televisions, liquid crystal monitors used in personal computers and in laptop computers, LCD screens in mobile phones and in digital cameras. However, in different embodiments, the present invention can also include display devices using OLED (Organic Light Emitting Diode) panels or other panels.

Figure 1:
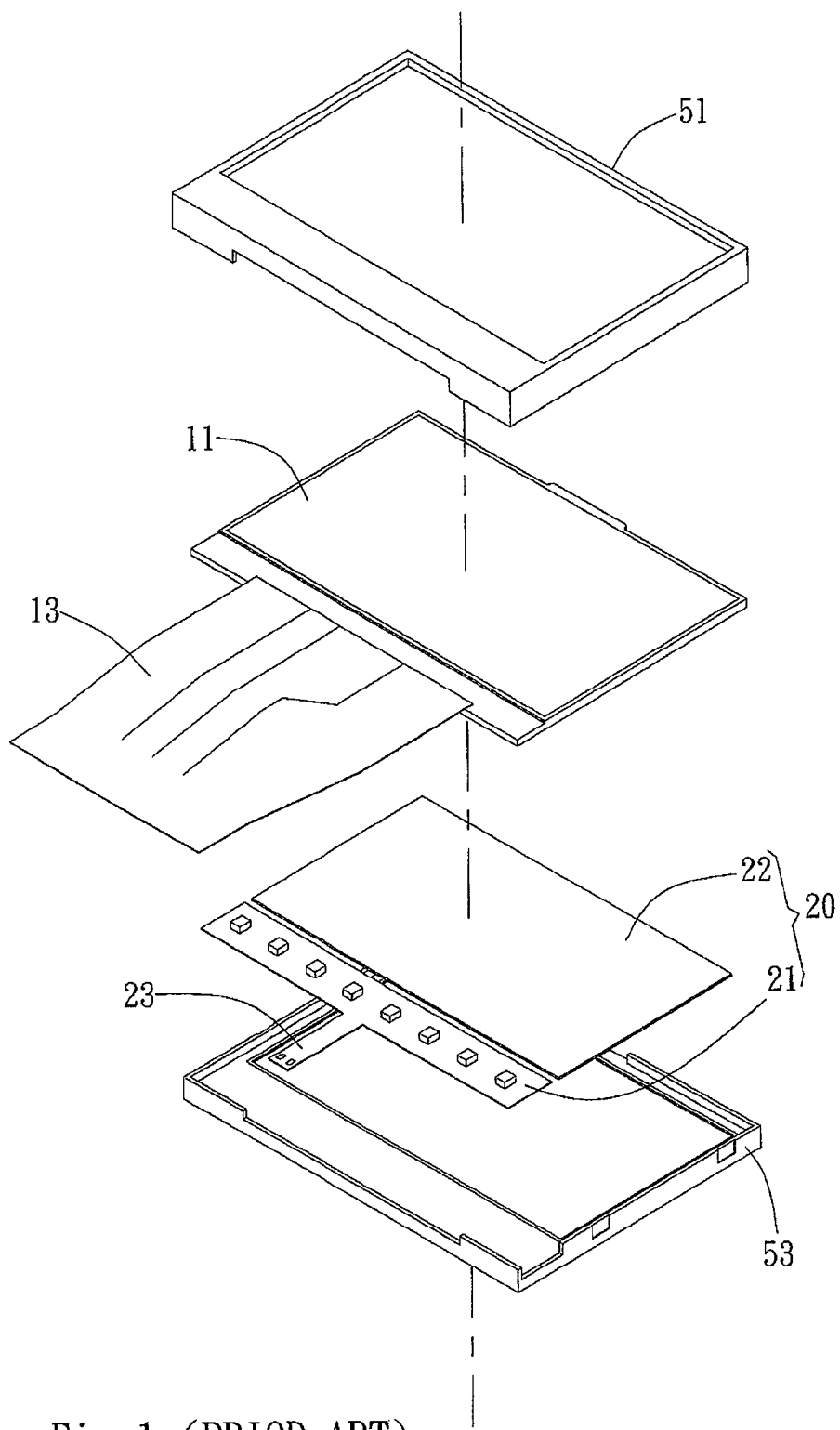
FIG. 1 illustrates a perspective view of a conventional display panel.
Figure 2:
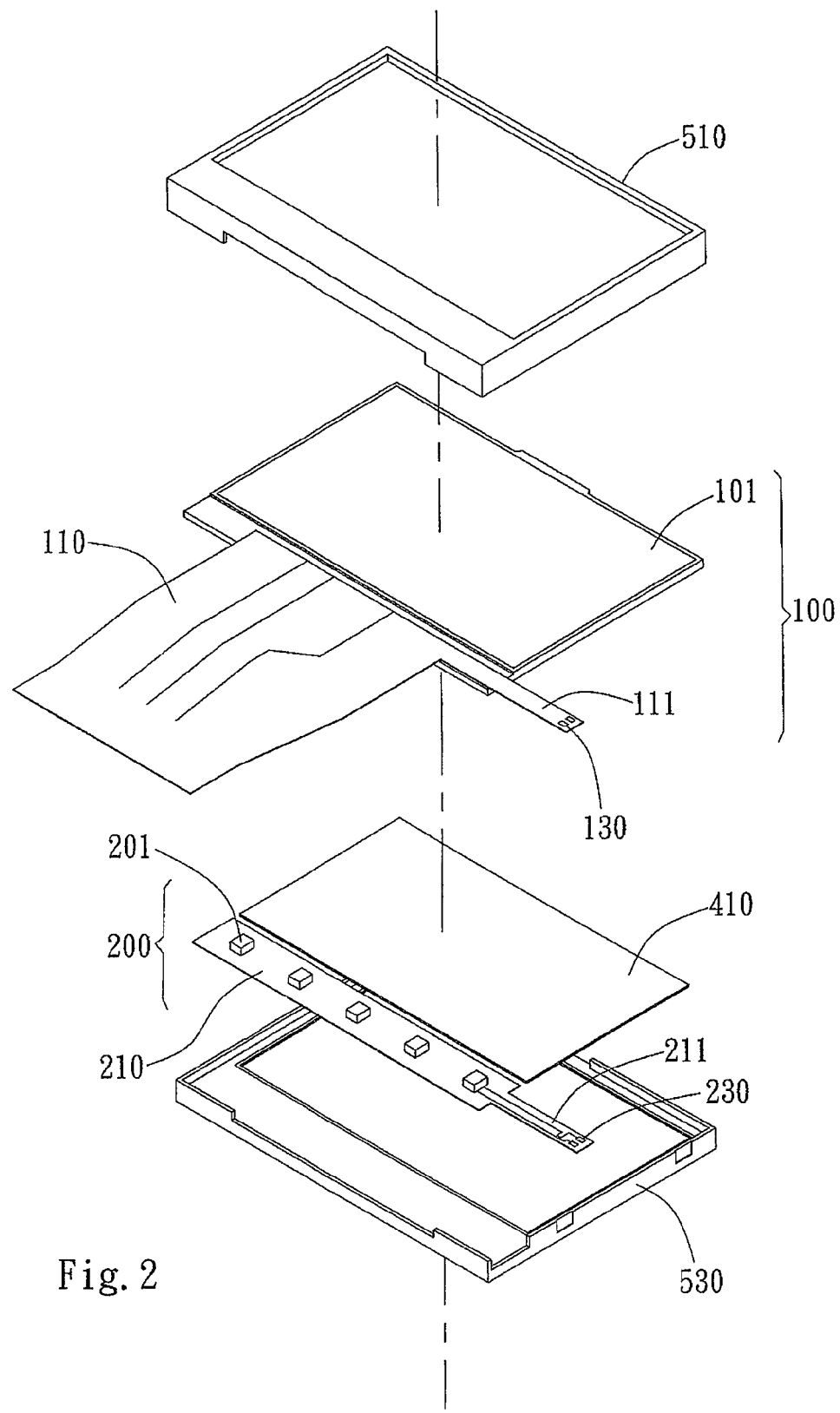
FIG. 2 illustrates an exploded view of one embodiment of the display device of the present invention.

In the embodiment illustrated in FIG. 2, the display device includes a first electronic module 100 and a second electronic module 200. The first electronic module 100 preferably partly overlaps the second electronic module 200. In the present embodiment, the first electronic module 100 includes a display panel module which preferably includes a liquid crystal panel module. The second electronic module 200 includes a light source module and is disposed beneath the first electronic module 100. However, in different embodiments, the first electronic module 100 can include OLED (Organic Light Emitting Diode) panel module or other panel modules while the second electronic module 200 can include touch sensor module or other modules which can partly overlap the first electronic module 100. Furthermore, as FIG. 2 shows, the display device can further include a frame which consists of an upper frame 510 and a lower frame 530. The frame is provided to accommodate the first electronic module 100 and the second electronic module 200. In the present embodiment, the upper frame 510 includes a front frame and the display panel module of the first electronic module 100 displays images outwards through the upper frame 510.

As FIG. 2 shows, the first electronic module 100 includes a panel 101 and a first signal transmission unit 110. In the present embodiment, the first signal transmission unit 110 includes a flexible circuit board which extends outwards from the panel 101 and is connected to the external signal sources in order to transmit signals from the external signal sources to the panel 101. However, in different embodiments, the first signal transmission unit 110 can include cables, thin films or other components with similar capabilities. One side of the first signal transmission unit 110 extends to form the first extension section 111. The extending direction of the first extension section 111 is preferably perpendicular to the extending direction of the first signal transmission unit 110 and has at least one contact point disposed thereon. As FIG. 2 shows, the first signal transmission unit 110 extends away from the panel 101 and the first extension section 111 preferably extends to form an elongated structure and extends outside of the panel 101. The first extension section 111 and the first signal transmission unit 110 are preferably integrated and made of the same flexible circuit board through cutting.

In the present embodiment, the second electronic module 200 includes a light source module with at least one light emitting element 201 (such as a light emitting diode) disposed thereon. However, in different embodiments, the light emitting element 201 can include different types of lamps or other light sources. As FIG. 2 shows, the second electronic module 200 and the adjacent light guide plate 410 together form a backlight module and are disposed beneath the first electronic module 100 in order to provide the backlight required by the panel 101 of the first electronic module 100. However, in the embodiment shown in FIG. 3, the second electronic module 200 can also include light emitting elements 201 arranged in the form of a matrix and disposed beneath the panel 101 in order to form a bottom lighting backlight module without the use of light guide plate.

Figure 3:
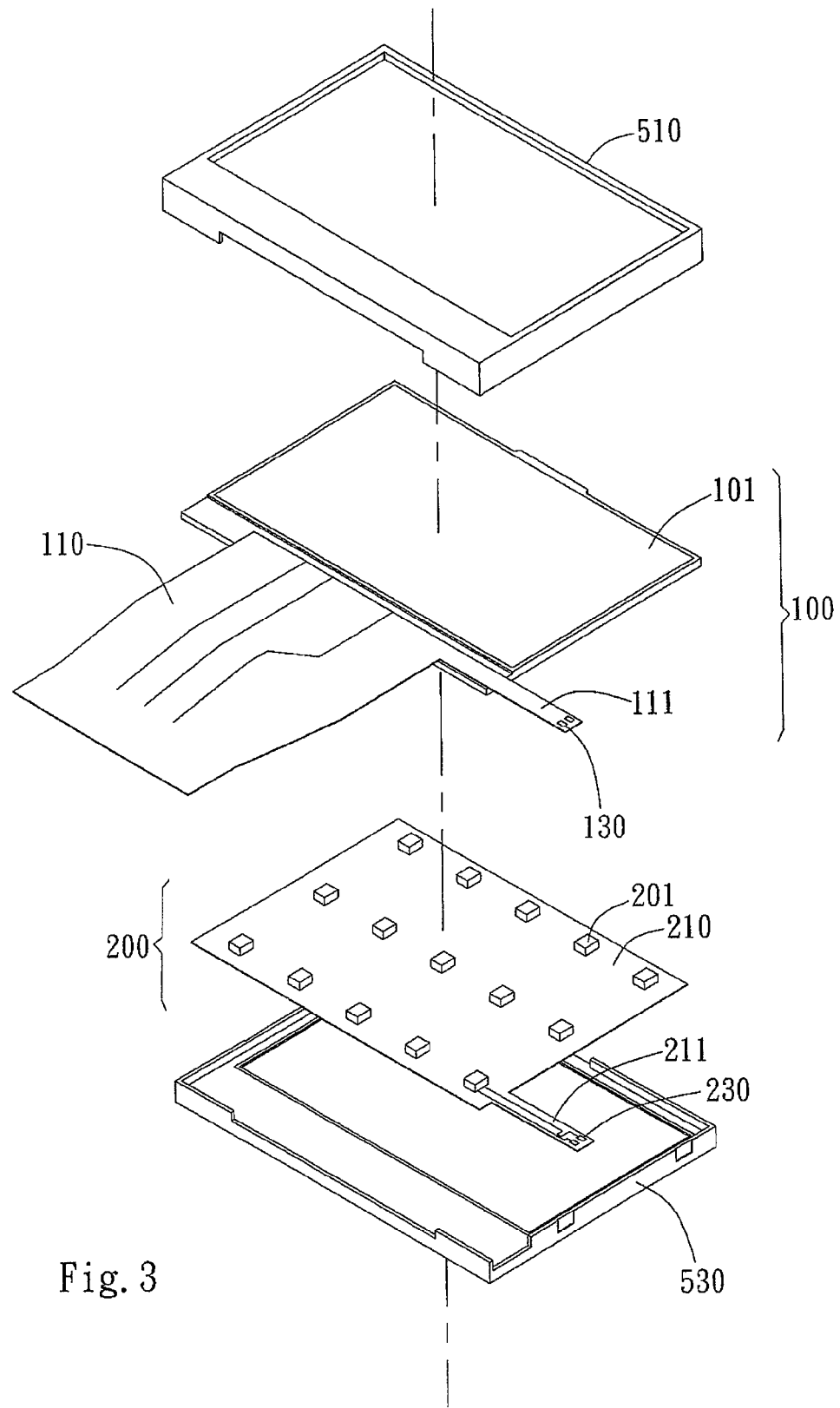
FIG. 3 illustrates an exploded view of another embodiment of the display device of the present invention.

As FIG. 2 and FIG. 3 show, the second electronic module 200 includes a second signal transmission unit 210. In the present embodiment, the second signal transmission unit 210 includes a flexible circuit board disposed beneath the light emitting element 201 and connected to external signal sources in order to transmit signals to the light emitting element 201. However, in different embodiments, the second signal transmission unit 210 can include printed circuit boards, thin film or other components with similar capabilities. One side of the second signal transmission unit 210 extends to form a first connection section 211. The extending direction of the first connection section 211 is preferably parallel to the first extension section 111 of the first signal transmission unit 110, and the first connection section 211 has at least one contact point 230 disposed thereon. As FIG. 2 and FIG. 3 show, the first connection section 211 preferably extends in parallel to one side of the panel 101. Furthermore, the first connection section 211 preferably extends to form an elongated structure and extends outside of the panel 101. The first connection section 211 preferably includes a flexible circuit board. The first connection section 211 and the second signal transmission unit 210 are preferably integrated and made of the same flexible circuit board through cutting. However, in different embodiments, the first connection section 211 can include thin films, cables or other flexible components and can be connected to the second signal transmission unit 210 through soldering or other coupling methods.

Figure 4A:
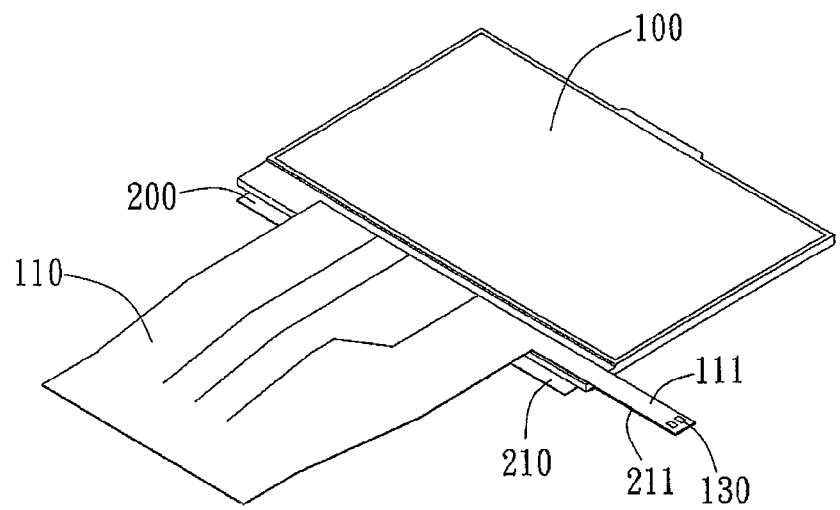
FIG. 4a illustrates a perspective view of one embodiment when the first electronic module is assembled with the second electronic module.
Figure 4B:
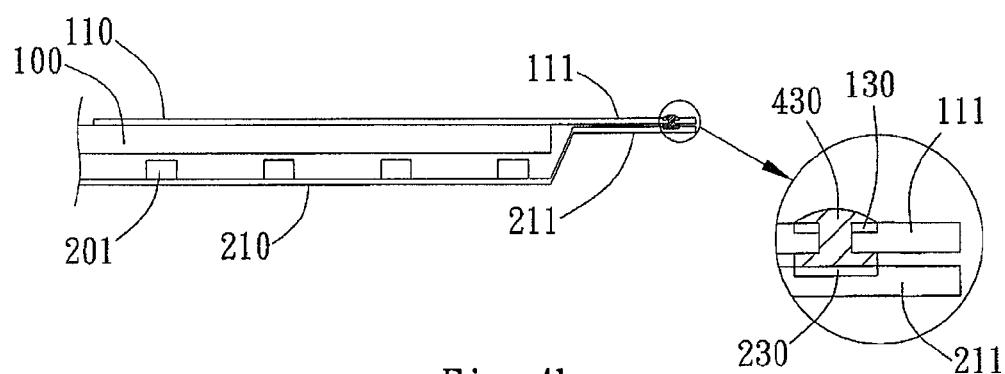

As FIG. 4a and FIG. 4b show, the first electronic module 100 partly overlaps the top of the second electronic module 200, and the first signal transmission unit 110 partly overlaps the second signal transmission unit 210. The first extension section 111 overlaps the first connection section 211, and the contact point 130 of the first extension section 111 and the contact point 230 of the first connection section 211 electrically couple with each other. In this way, the first connection section 211 electrically couples with the first extension section 111 and thus signals from the signal sources for controlling the second electronic module 200 can be transmitted from the first extension section 111 to the second electronic module 200 via the first connection section 211.

Figure 4C:
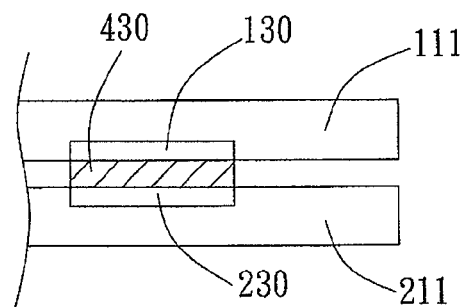
FIG. 4C is a sectional view of the portion of the embodiment encircled in Fib. 4b.

As FIG. 4b shows, the contact points 130 and 230 are preferred to be electrically coupled by soldering, using adhesive or other suitable methods. The above-mentioned soldering technique preferably includes iron soldering, press-soldering, laser soldering or other soldering method having similar effect. The adopted soldering technique needs to correspond to the contact point 130 of the first extension section 111 and the contact point 230 of the first connection section 211 as well as the wires in the circuit. As FIG. 4b shows, when the contact points 130 and 230 are facing the same direction, it is preferred to adopt iron soldering, laser soldering or similar soldering techniques to form a solder joint 430. As FIG. 4c shows, When the contact points 130 and 230 face each other, it is advisable to adopt press-soldering or other similar solder techniques to form a solder joint 430.

Figure 5A:
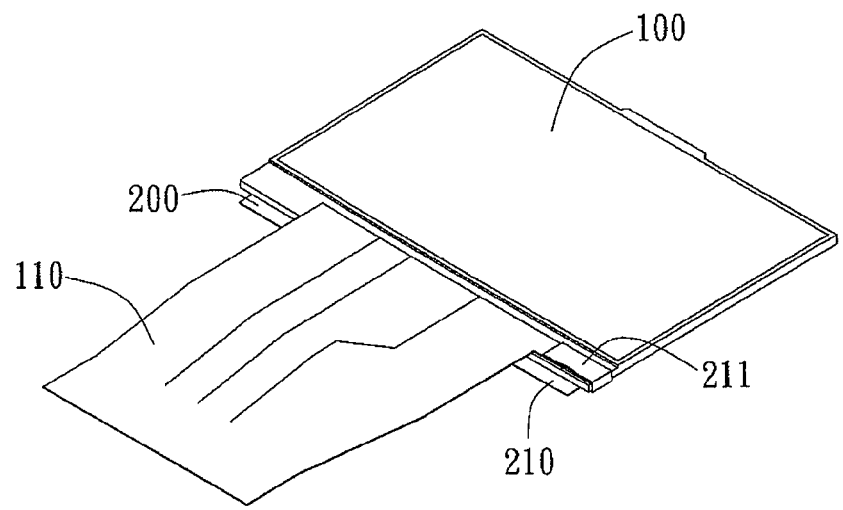
FIG. 5a illustrates the perspective view of an embodiment in which the first extension section and the first connection section are bent upwards.
Figure 5B:
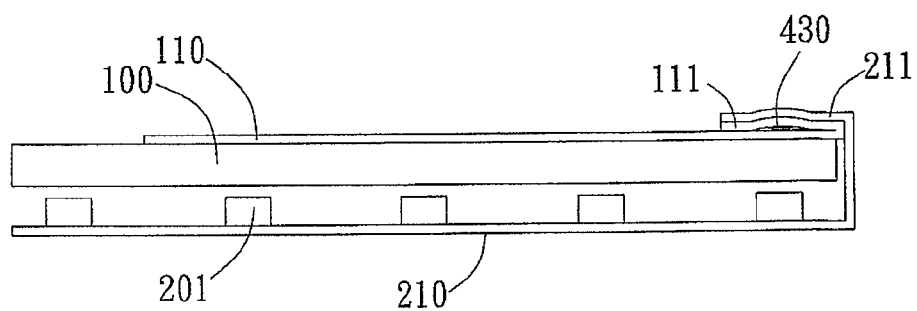
Figure 6A:
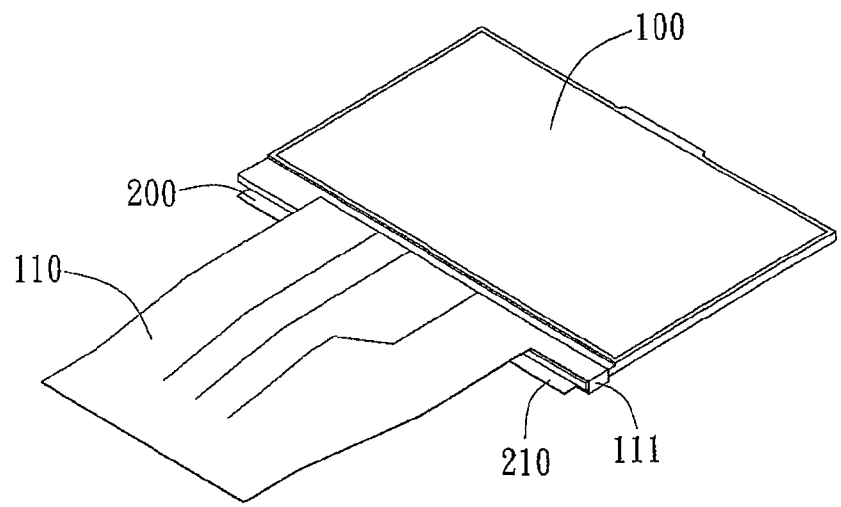
FIG. 6a and FIG. 6b illustrate the perspective view of an embodiment in which the first extension section and the first connection section are bent downwards.
Figure 6B:
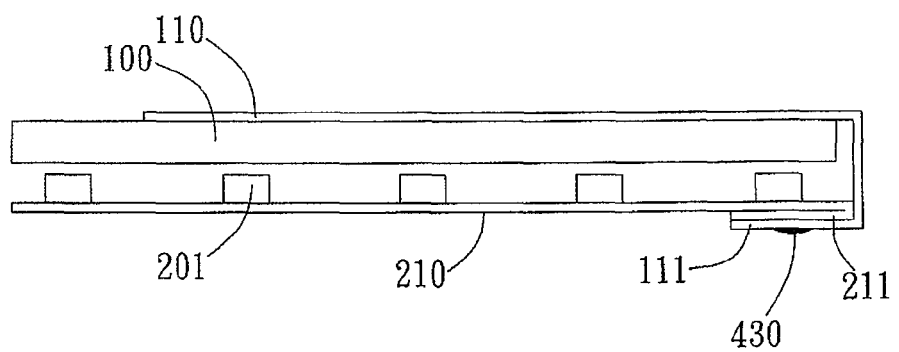

Referring to FIG. 5a and FIG. 5b as well as FIG. 2, the first extension section 111 and the first connection section 211 electrically couple to each other and bend to partly overlap the second signal transmission unit 210. In this preferable embodiment, the bent first extension section 111 and the bent first connection section 211 can be accommodated between the upper frame 510 and the lower frame 530 and placed on the first electronic module 100. Furthermore, in the present embodiment, the first extension section 111 and the first connection section 211 are bent upwards and overlap the top of the first electronic module 100. Although the first electronic module 100 is disposed between the bent first extension section 111 and the first connection section 211 and the second signal transmission unit 210, the first extension section 111, the first connection section 211 and the second signal transmission unit 210 still partly overlap one another as shown in the cross-section view in FIG. 5b. In the embodiment illustrated in FIG. 6a and in FIG. 6b, the first extension section 111 and the first connection section 211 are bent downwards below the bottom of the second electronic module 200 and partly overlap the second signal transmission unit 210.

Figure 7A:
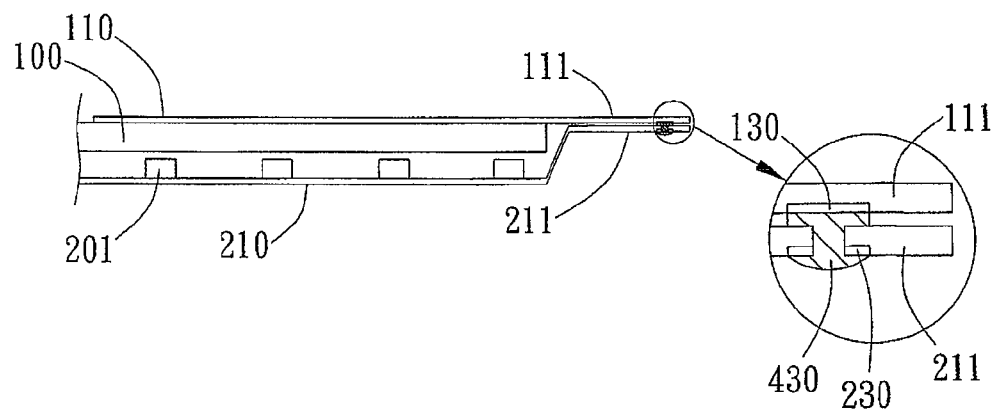
FIG. 7a, FIG. 7b and FIG. 7c illustrate another embodiment of display device of the present invention.
Figure 7B:
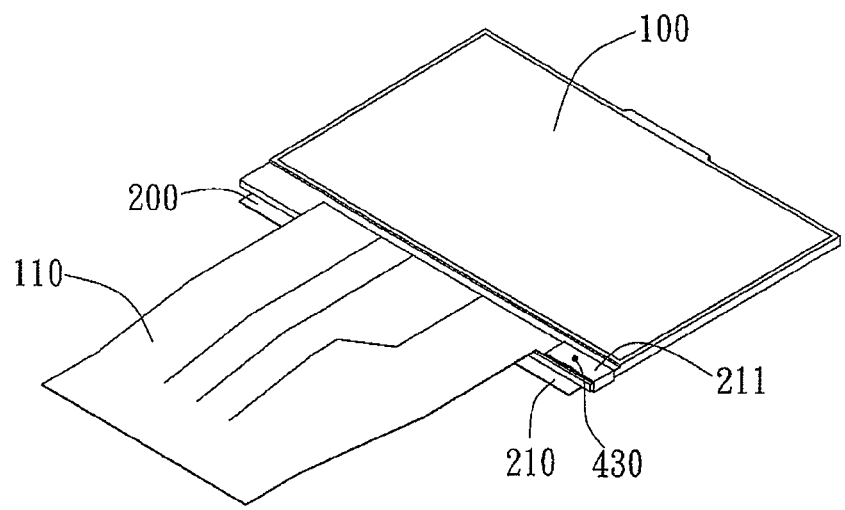
Figure 7C:
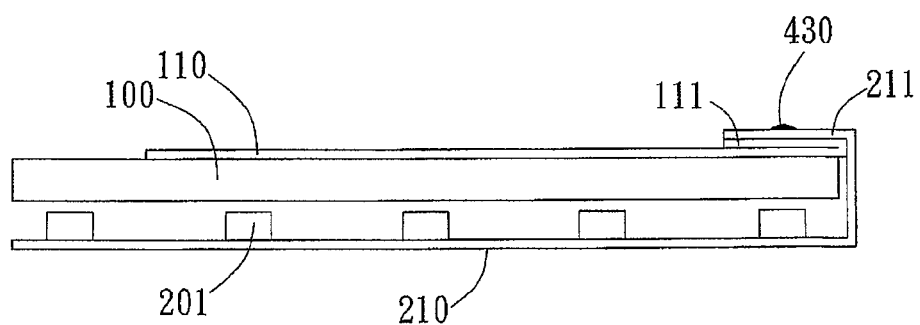

FIG. 7a, FIG. 7b and FIG. 7c illustrate another embodiment of the present invention. As FIG. 7a shows, the solder joint 430 electrically couples the contact point 130 of the first extension section 111 with the contact point 230 of the first connection section 211 and also protrudes from the first connection section 211. In other words, the solder joint 430 appears on the surface of the first connection section 211. Referring to FIG. 7b and FIG. 7c, the first extension section 111 and the first connection section 211 are electrically coupled and bent to partly overlap the second signal transmission unit 210. However, in this embodiment, the solder joint 430 is disposed on top of both the first signal transmission unit 110 and the the first connection section 211.

Figure 8A:
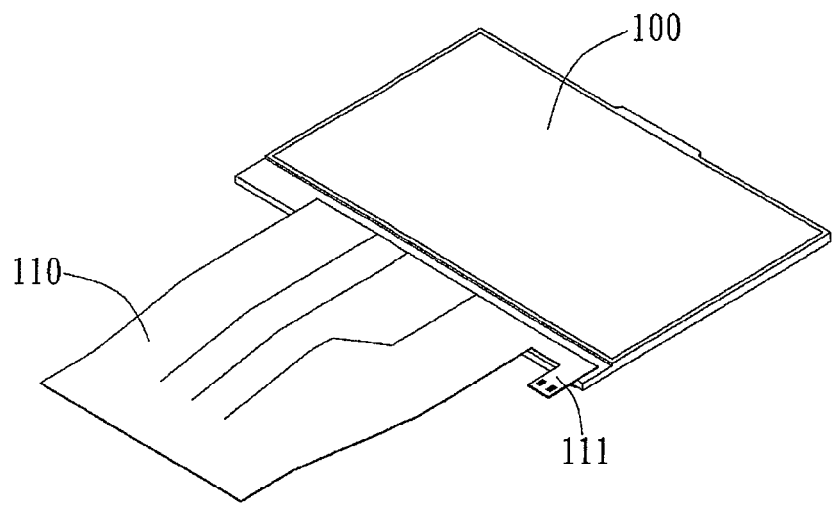
FIG. 8a, FIG. 8b and FIG. 8c illustrate yet another embodiment of the display device of the present invention.
Figure 8B:
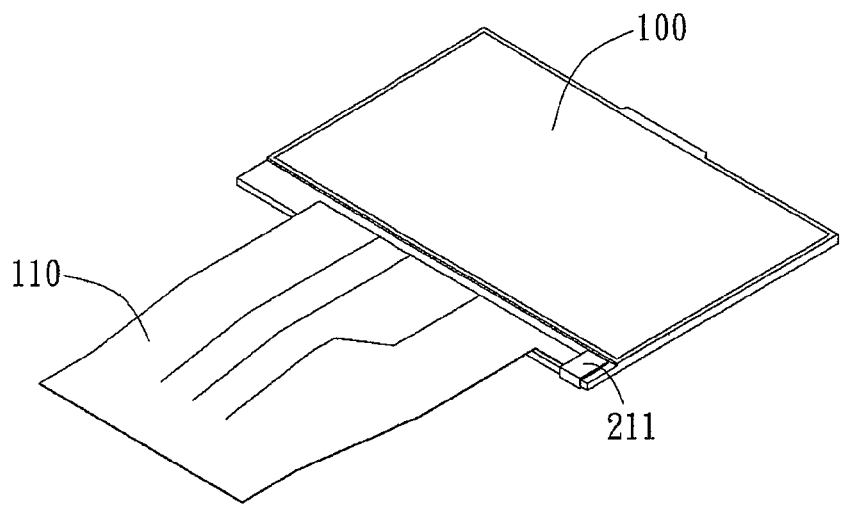
Figure 8C:
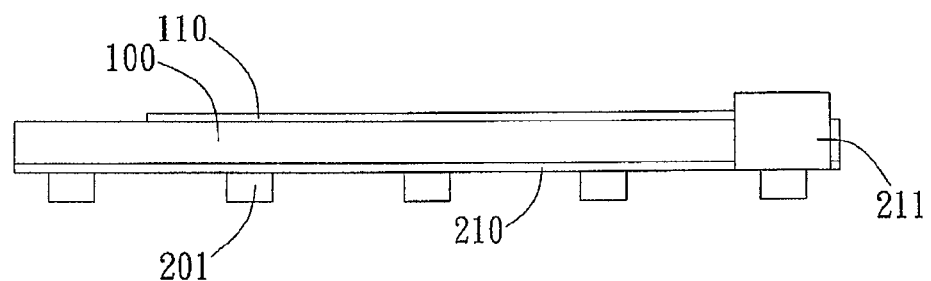

In the embodiment illustrated in FIG. 8a, FIG. 8b and FIG. 8c, the light emitting elements 201 are disposed on one side of the second signal transmission unit 210 not facing the first electronic module 100. Furthermore, in the present embodiment, the extending directions of both the first extension section 111 and the first connection section 211 are parallel to that of the first signal transmission unit 110. The first extension section 111 and the first connection section 211 are bent above or beneath the first electronic module (not numbered) and the second electronic module (not number). However, in the present embodiment, the extending directions of both the first extension section 111 and the first connection section 211 can be perpendicular to that of the first signal transmission unit 110.

Figure 9:
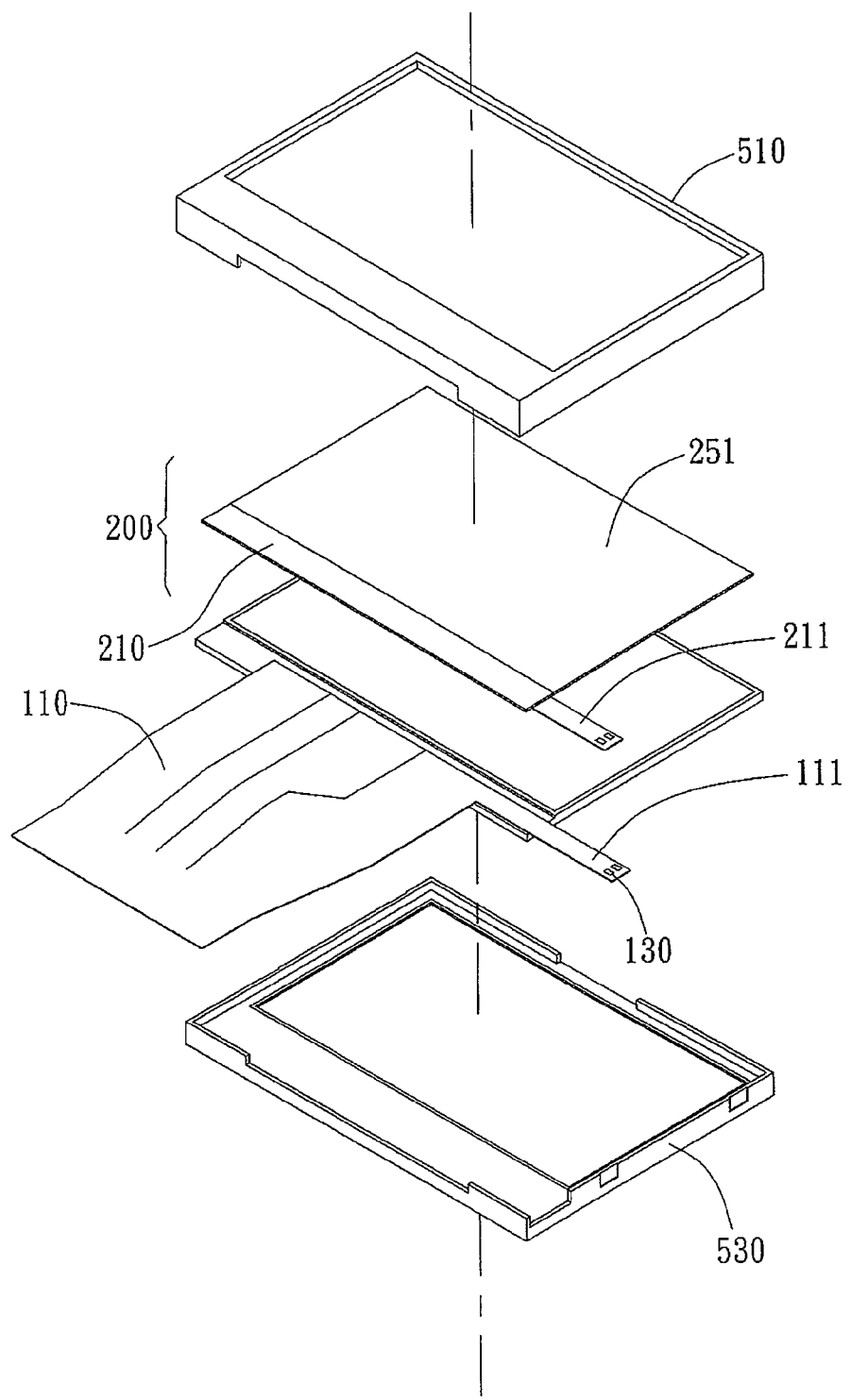
FIG. 9 illustrates a perspective view of the embodiment in which a touch sensor module is used as the second electronic module.

As FIG. 9 shows, the second electronic module 200 can include a touch sensor module and overlaps the top of the first electronic module 100. The touch sensor module includes a sensing plate 251 and a second signal transmission unit 210. The second signal transmission unit 210 is connected to the bottom of the sensing plate 251 and transmits the sensor signals (transmitted by the sensing plate) 251 to the back-end for further processing. The first connection section 211 extends from one side of the second signal transmission unit 210 and is parallel to the first extension section 111 of the first electronic module 100. The first connection section 211 and the first extension section 111 overlap to be electrically coupled and are partly bent to overlap the top or the bottom of the first electronic module 100 and the second electronic module 200. The electrical coupling between the first connection section 211 and the first extension section 111 allows the signals detected by the second electronic module 200 to be transmitted from the first connection section 211 to the first extension section 111; the detected signals are then transmitted from the first signal transmission unit 110 to the back-end for further processing.

Figure 10A:
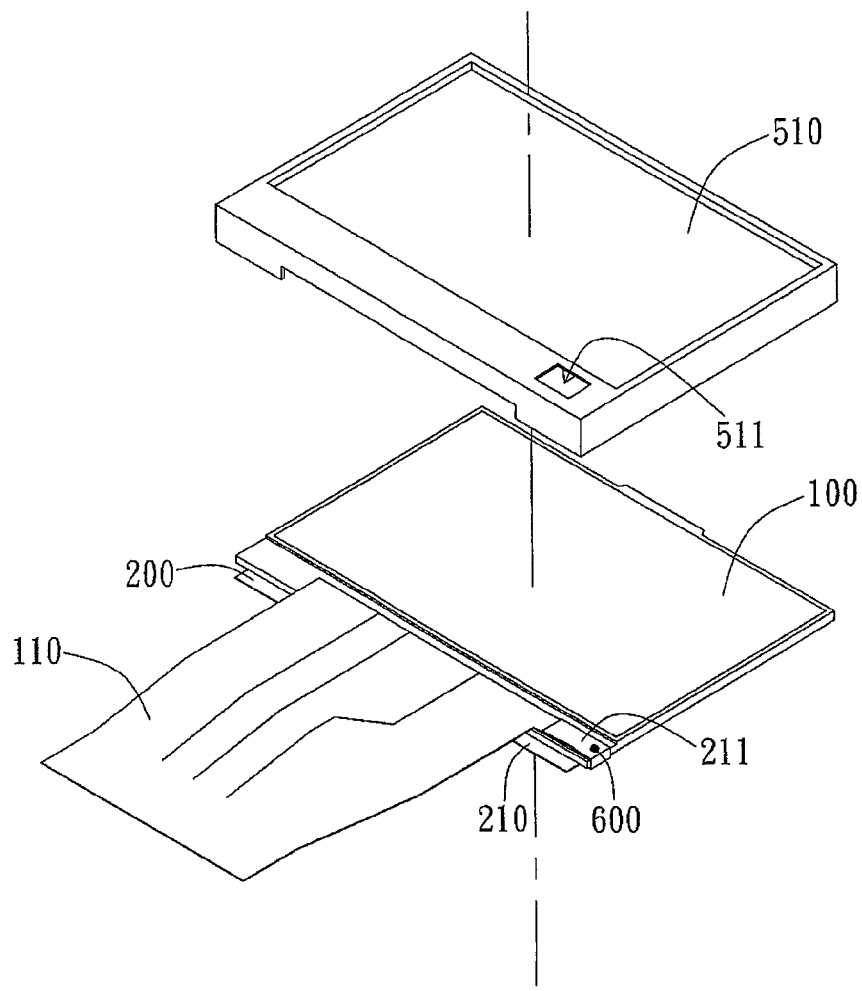
FIG. 10a illustrates the embodiment in which the frame has an opening.
Figure 10B:
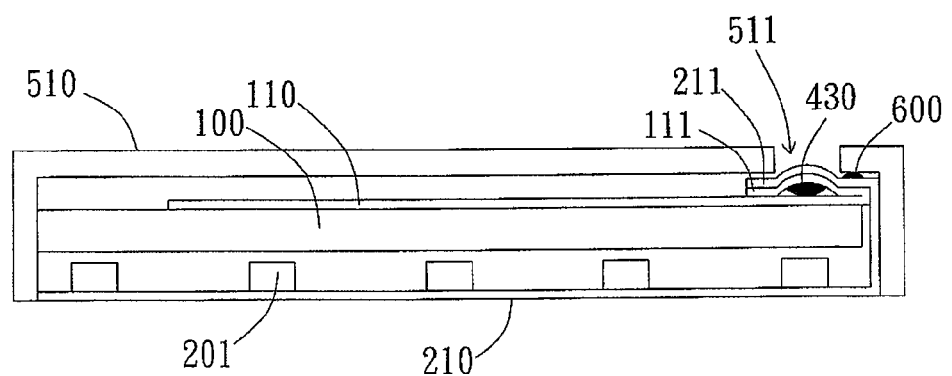
Figure 10C:
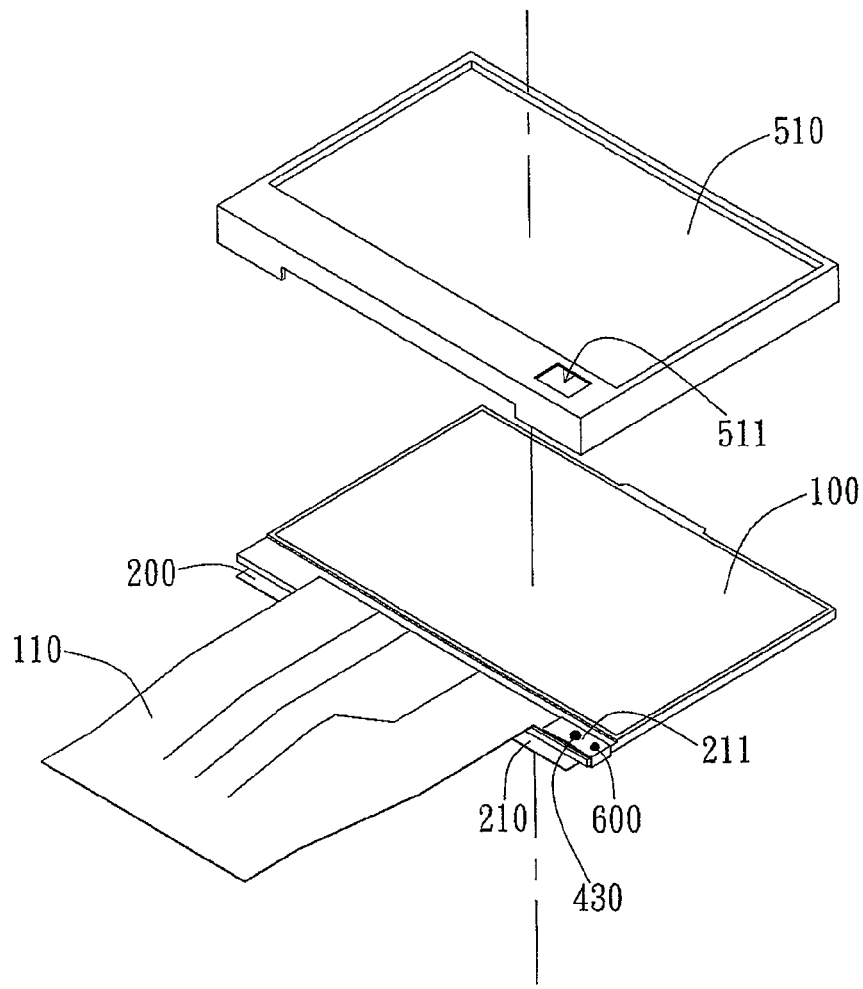
FIG. 10c illustrates yet another embodiment in which the frame has an opening.
Figure 10D:
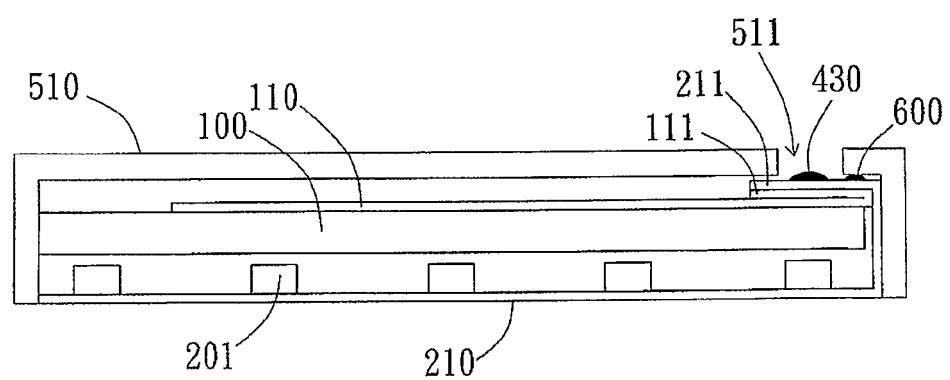
FIG. 10d illustrates the cross-section view of the embodiment illustrated in FIG. 10d.

Referring to the embodiment illustrated in FIG. 10a and in FIG. 10b, when the first extension section 111 and the first connection section 211 are bent upwards to overlap the top of the first electronic module 100. An opening 511 can be formed at one corner of the upper frame 510. The opening 511 corresponds to and exposes part of the combination of the first extension section 111 and the first connection section 211. Soldering or other similar methods often thickens the joint during electrical coupling and the thickened joint thus can protrude outwards from the opening 511. Furthermore, in the embodiment illustrated in FIG. 10a and in FIG. 10b, the upper frame 510 and the lower frame 530 have electrical conductivity and a ground point 600 is disposed on the first extension section 111 or on the first connection section 211. The ground point 600 contacts the upper frame 510 or the lower frame 530 to establish grounding effect. In order to ensure the contact with the upper frame 510 or with the lower frame 530, the ground point 600 needs to be disposed on top of the bent part of the first extension section 111 or the first connection section 211. Referring to another embodiment illustrated in FIG. 10c, FIG. 10d and also FIG. 7c, the solder joint 430 protrudes from the first connection section 211 and into the opening 511 formed at one corner of the upper frame 510. The solder joint 430 is preferred to be situated with the opening 511, but is not limited thereto. In other embodiment, the solder joint 430 can also protrude from the opening 511.

Figure 11A:
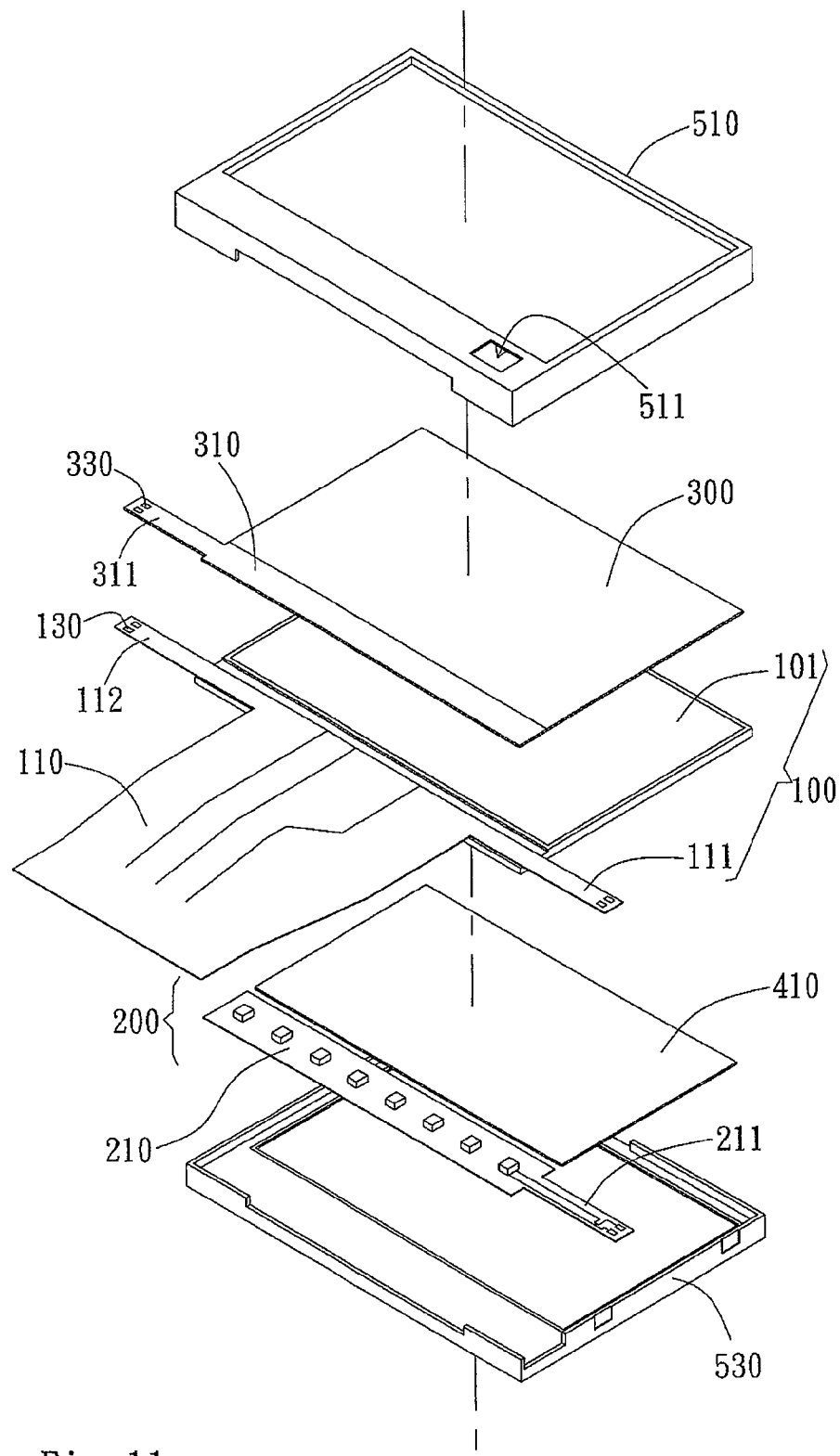
FIG. 11a illustrates the exploded view of another embodiment of the display device.
Figure 11B:
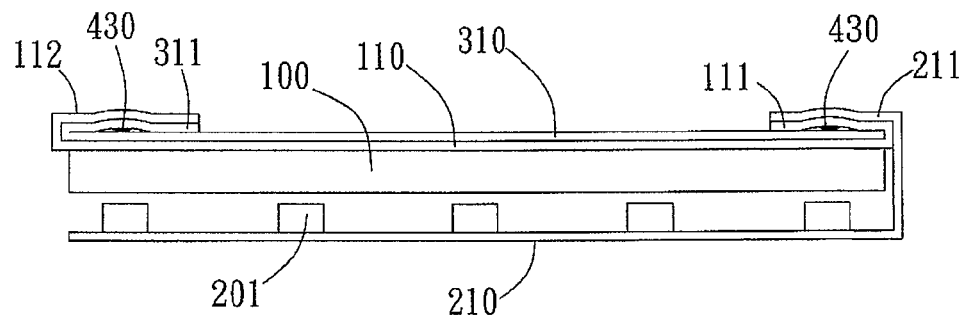
FIG. 11b illustrates the cross-section view of the embodiment illustrated in FIG. 11a in which the display device is assembled.

In the embodiment illustrated in FIG. 11a and in FIG. 11b, the display device further includes a third electronic module 300. The third electronic module 300 partly overlaps the first electronic module 100. The second electronic module 200 and the third electronic module 300 are disposed on two opposite sides of the first electronic module 100. In the present embodiment, the first electronic module 100 is a display panel module, the second electronic module 200 is a light source module and the third electronic module 300 is a touch sensor module. One side of the first signal transmission unit 110 of the first electronic module 100 extends to form a second extension section 112. The extending direction of the second extension section 112 is preferred to be perpendicular to the extending direction of the first signal transmission unit 110 and is preferred to have a contact point 130 disposed thereon. However, in different embodiments, the extending direction of the second extension section 112 can be parallel to that of the first signal transmission unit 110. As FIG. 11a shows, the second extension section 112 preferably extends to form an elongated structure and extends out of the lateral side of the panel 101. The second connection section 311 is preferred to be made of flexible circuit board. The second connection section 311 and the third signal transmission unit 310 are preferably integrated and made of the same flexible circuit board through cutting. However, in different embodiments, the second connection section 311 can include thin films, cables or other flexible components and can be connected to the second signal transmission unit 210 through soldering or other coupling methods.

As FIG. 11a and FIG. 11b show, the second connection section 311 and the second extension section 112 overlap to be electrically coupled and are partly bent to overlap the top or the bottom of the first electronic module 100 and that of the second electronic module 200. The electrical coupling between the second connection section 311 and the second extension section 112 allows the signals received by the third electronic module 300 to be transmitted from the second connection section 311 to the second extension section 112; the detected signals are then transmitted from the first signal transmission unit 110 to the back-end for further processing.

Figure 11C:
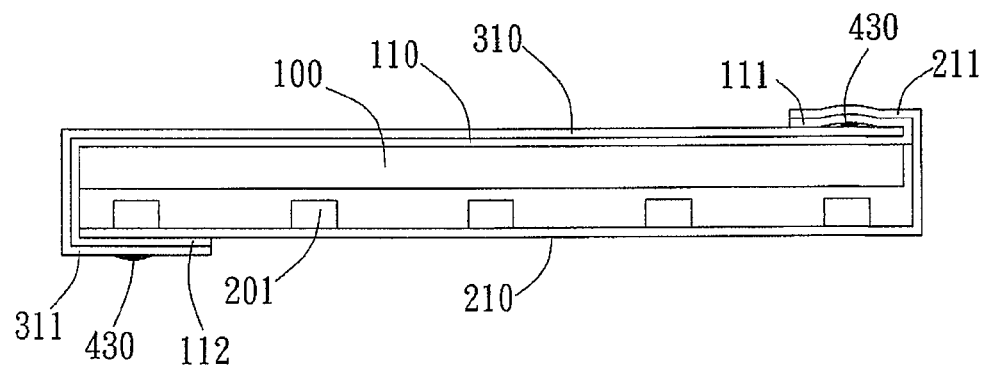
FIG. 11c illustrates the cross-section view of another embodiment of the display device.
Figure 12:
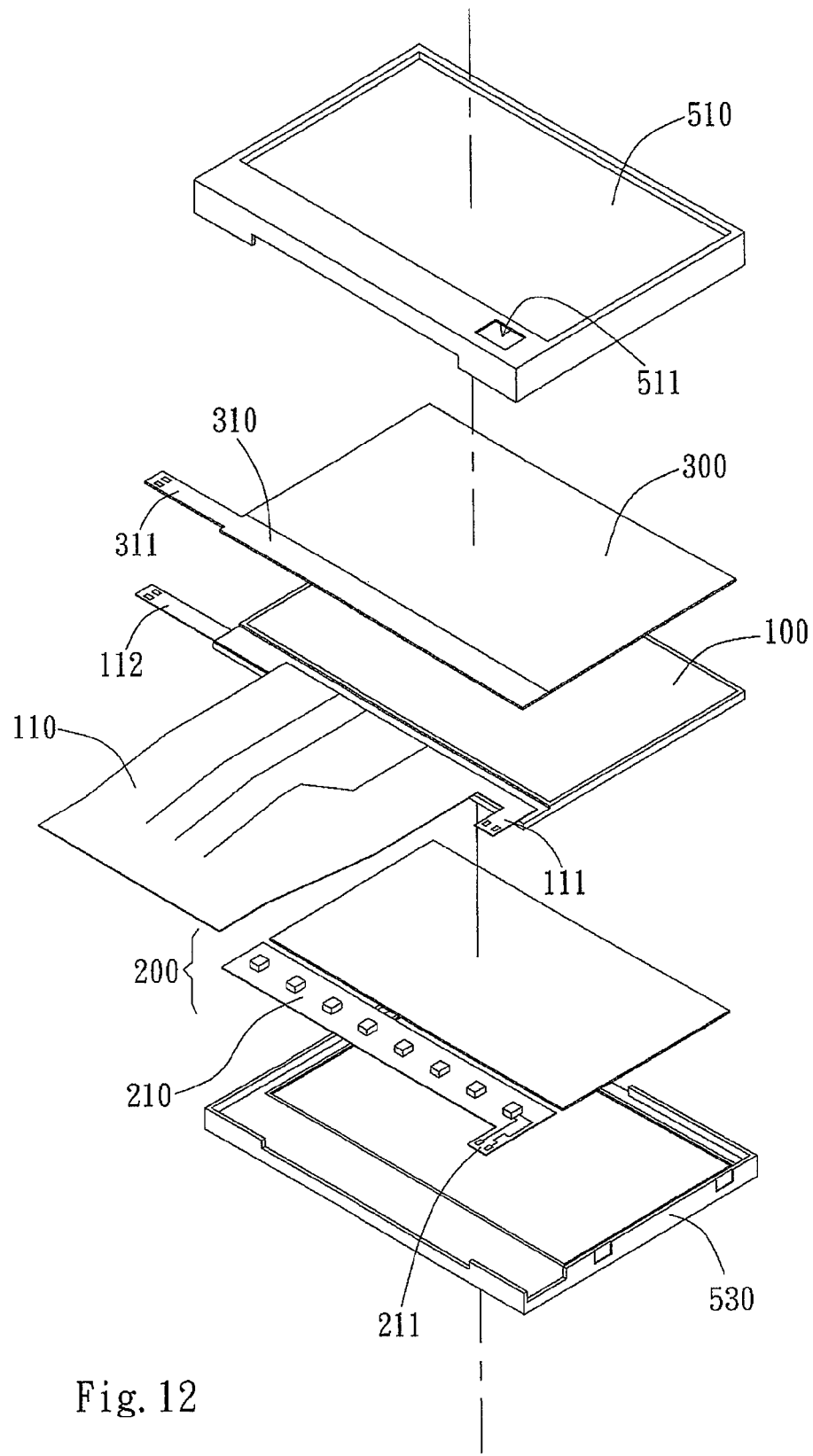
FIG. 12 illustrates the exploded view of another embodiment of the display device.

In the present embodiment, as FIG. 11b shows, the combination of first extension section 111 and the first connection and that of the second extension section 112 and the second connection section 311 are bent and disposed on the same side of the first electronic module 100. However, in the embodiment illustrated in FIG. 11c, the combination of first extension section 111 and the first connection section 211 and that of the second extension section 112 and the second connection section 311 can also be bent and disposed on two opposite sides of the first electronic module 100. Furthermore, in the embodiment illustrated in FIG. 12, the combination of the first extension section 111 and the first connection section 211 and that of the second extension section 112 and the second connection section 311 can be perpendicular to each other.

Figure 13:
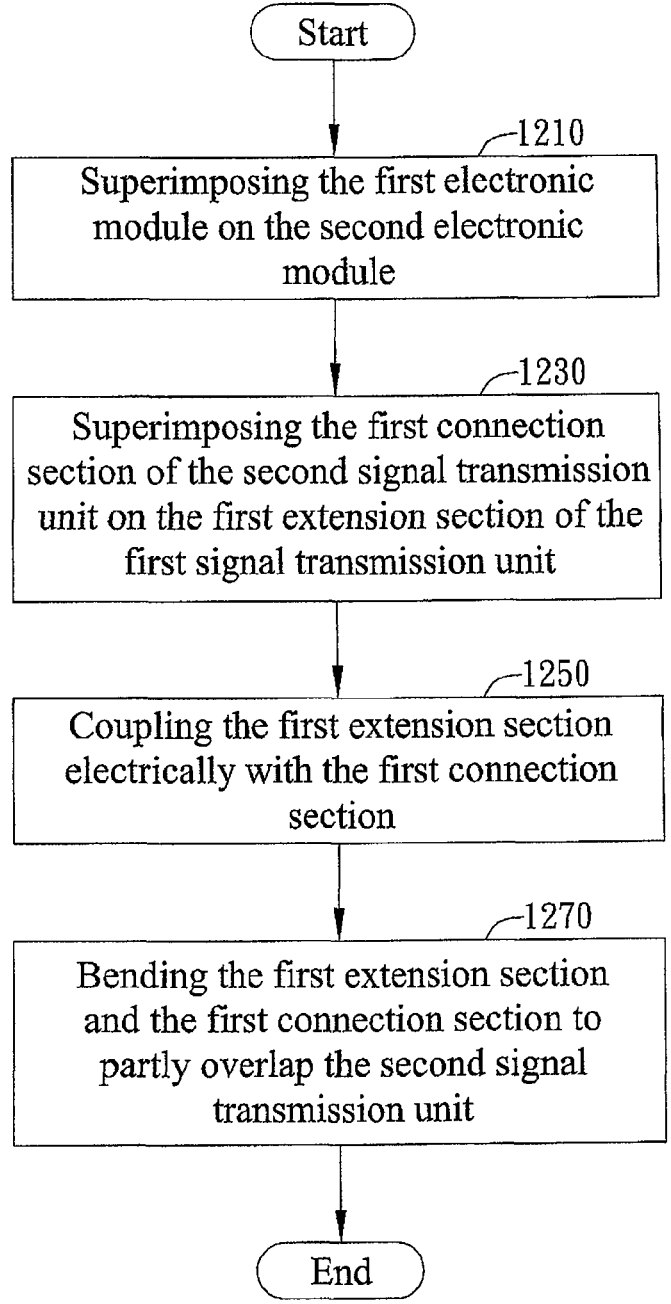
FIG. 13 illustrates the flow chart of an embodiment of the assembly method of the display device.

The present invention also provides an assembly method of the display device. As FIG. 13 shows, the assembly method includes step 1210 of superimposing the first electronic module 100 on the second electronic module 200 so that the first signal transmission unit of the first electronic module 100 partly overlaps the second signal transmission unit of the second electronic module 200, step 1230 of superimposing the first connection section 211 of the second signal transmission unit 210 on the first extension section 111 of the first signal transmission unit 110 and step 1250 of coupling the first extension section 111 electrically with the first connection section. In more preferred embodiments, the electrical coupling method includes iron soldering, press-soldering, laser soldering, using adhesive or other methods with identical effect.

The step 1270 includes bending the first extension section 111 and the first connection section 211 to partly overlap the second signal transmission unit 210. In the present step, it can be seen that the first extension section 111 and the first connection section 211 are bent to overlap the top or the bottom of the first electronic module 100. Furthermore, the present step can bend the first extension section 111 and the first connection section 211 to be parallel to or perpendicular to the extending direction of the first signal transmission unit 110 according to their extending directions.

Figure 14:
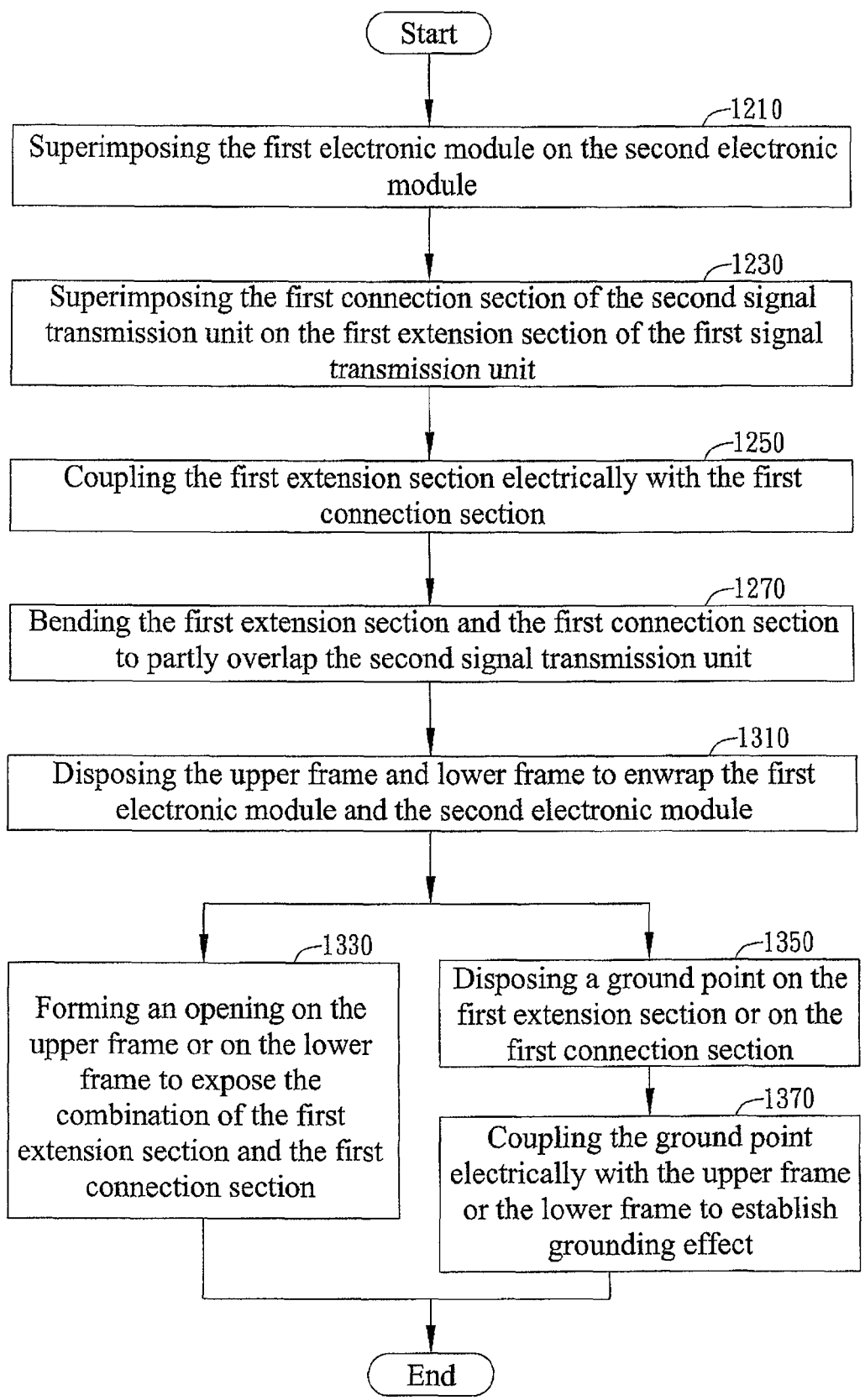
FIG. 14 illustrates the flow chart of another embodiment of the assembly method of the display device.

As FIG. 14 shows, the assembly method further includes step 1310 of disposing the upper frame 510 and lower frame 530 to enwrap the first electronic module 100 and the second electronic module 200. In more preferred embodiments, the bent first extension section 111 and the first connection section 211 do not protrude out of the upper frame 510 and the lower frame 530. The step 1330 includes forming an opening 511 on the upper frame 510 or on the lower frame 530 to expose the combination of the first extension section 111 and the first connection section. The step 1350 includes disposing a ground point 600 on the first extension section 111 or on the first connection section 211. The step 1370 includes coupling the ground point 600 electrically with the upper frame 510 or the lower frame 530 in order to establish grounding effect. In order to ensure the contact with the upper frame 510 or with the lower frame 530, the ground point 600 needs to be disposed on top of the bent part of the first extension section 111 or the first connection section.

Figure 15:
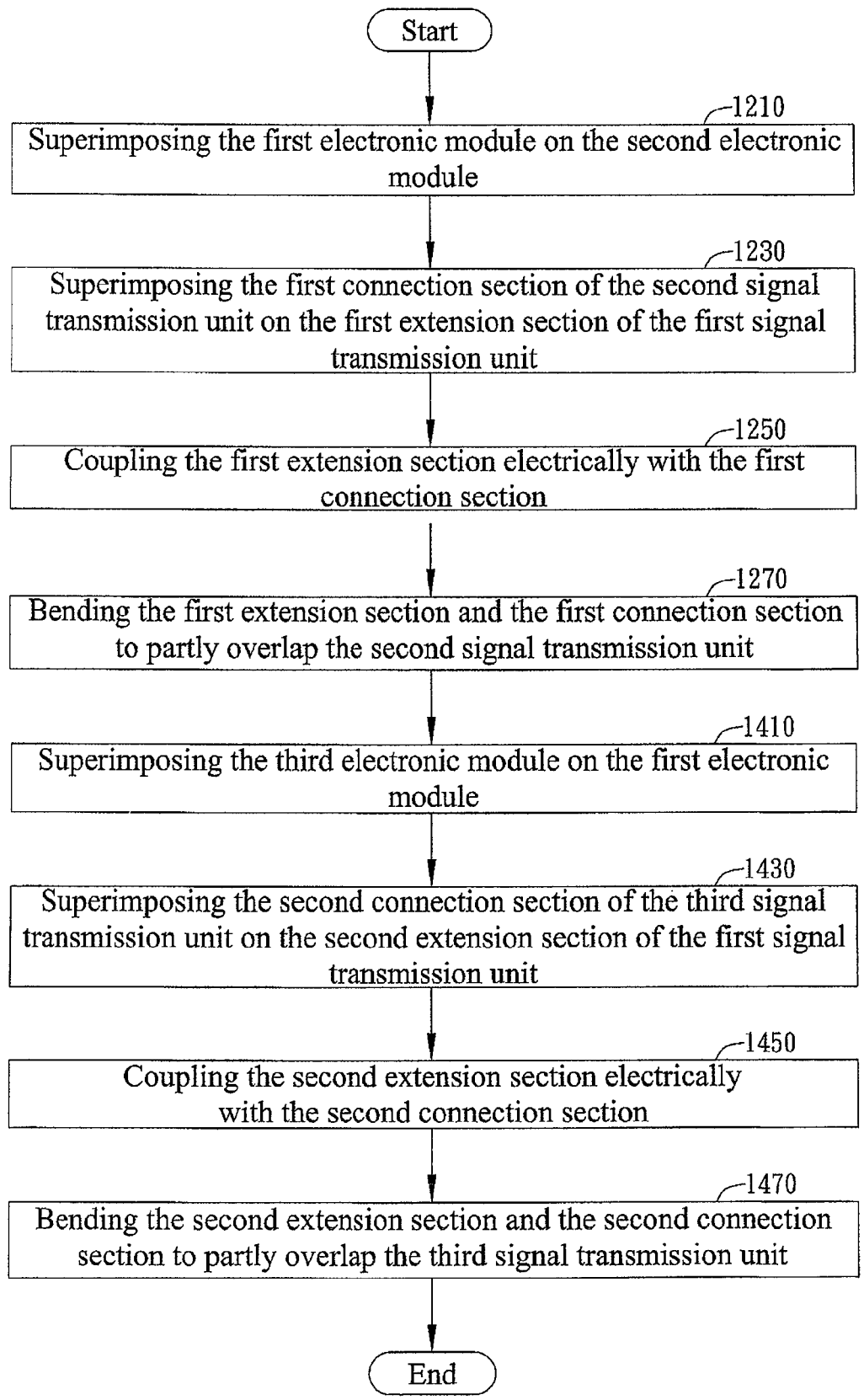
FIG. 15 illustrates the flow chart of yet another embodiment of the assembly method of the display device.

In the embodiment illustrated in FIG. 15, the assembly method furthers includes step 1410 of superimposing the third electronic module 300 on the first electronic module 100 so that the first signal transmission unit 110 of the first electronic module 100 partly overlaps the third signal transmission unit 310 of the third electronic module 300. The third electronic module 300 and the second electronic module 200 are preferred to be disposed on two opposite sides of the first electronic module 100. The step 1430 includes superimposing the second connection section 311 of the third signal transmission unit 310 on the second extension section 112 of the first signal transmission unit 110. The step 1450 includes coupling the second extension section 112 electrically with the second connection section 311; in more preferred embodiments, the electrical coupling method includes iron soldering, press-soldering, laser soldering, using adhesive or other methods with the same effect.

The step 1470 includes bending the second extension section 112 and the second connection section 311 to partly overlap the third signal transmission unit 310. In the present step, it can be seen that the second extension section 112 and the second connection section 311 are bent to overlap the top or bottom of the first electronic module 100. Furthermore, the present step can bend the second extension section 112 and the second connection section 311 to be parallel to or perpendicular to the extending direction of the first signal transmission unit 110 according to their extending directions.

The above is a detailed description of the particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:

1. A display device comprising:
   a first electronic module including a first signal transmission unit, wherein a side of the first signal transmission unit extends to form a first extension section; and
   a second electronic module including a second signal transmission unit, wherein the second electronic module partly overlaps the first electronic module, the first signal transmission unit partly overlaps the second signal transmission unit;
   wherein a side of the second signal transmission unit extends to form a first connection section, the first extension section and the first connection section are electrically coupled and together bent over at least one edge of the first signal transmission unit and the second signal transmission unit to partly overlap one of the first signal transmission unit and the second signal transmission unit.

2. The display device of claim 1, wherein the first electronic module includes a display panel module.

3. The display device claim 2, wherein the second electronic module includes a touch sensor module disposed above the display panel module.

4. The display device of claim 2, wherein the second electronic module includes a light source module disposed beneath the display panel module.

5. The display device of claim 4, wherein the light source module includes a LED light source module.

6. The display device of claim 1, wherein the first signal transmission unit includes a flexible circuit board.

7. The display device of claim 1, wherein the second signal transmission unit includes a flexible circuit board.

8. The display device of claim 1, wherein the first extension section and the first connection section are bent above the first electronic module.

9. The display device of claim 1, wherein an extending direction of the first extension section and an extending direction of the first connection section are in parallel with an extending direction of the first signal transmission unit.

10. The display device of claim 1, wherein an extending direction of the first extension section and an extending direction of the first connection section are perpendicular to an extending direction of the first signal transmission unit.

11. The display device of claim 1 further comprising a third electronic module partly overlapping the first electronic module, the third electronic module and the second electronic module disposed on two opposite sides of the first electronic module, wherein the third electronic module includes a third signal transmission unit partly overlapping the first signal transmission unit, and a side of the first signal transmission unit extends to form a second extension section, a side of the third signal transmission unit extends to form a second connection section, the second extension section and the second connection section are electrically coupled and are bent to partly overlap the third signal transmission unit.

12. The display device of claim 11, wherein the second electronic module includes a light source module and the third electronic module includes a touch sensor module.

13. The display device of claim 11, wherein a combination of the first extension section and the first connection section and a combination of the second extension section and the second connection section are respectively bent and disposed on two opposites sides of the first electronic module.

14. The display device of claim 11, wherein a combination of the first extension section and the first connection section and a combination of the second extension section and the second connection section are bent and disposed on one identical side of the first electronic module.

15. The display device of claim 1 further comprising a frame enwrapping the first electronic module and the second electronic module, wherein the frame has an opening corresponding to and exposing part of a combination of the first extension section and the first connection section.

16. The display device of claim 1 further comprising a frame enwrapping the first electronic module and the second electronic module, wherein the frame has an electrical conductivity, a ground point is disposed on one of the first extension section and the first connection section, the ground point is electrically coupled with the frame.

17. A display device assembly method comprising:
superimposing a first electronic module on a second electronic module wherein the first electronic module includes a first signal transmission unit and the second electronic module includes a second signal transmission unit;
superimposing a first extension section of the first signal transmission unit on a first connection section of the second signal transmission unit;
coupling the first extension section electrically with the first connection section; and
together bending the first extension section and the first connection section over at least one edge of the first signal transmission unit and the second signal transmission unit to partly overlap one of the first signal transmission unit and the second signal transmission unit.

18. The display device assembly method of claim 17, wherein the bending step includes bending the first extension section and the first connection section above the first electronic module.

19. The display device assembly method of claim 17, wherein the bending step includes bending the first extension section and the first connection section in a direction in parallel with an extending direction of the first signal transmission unit.

20. The display device assembly method of claim 17, wherein the bending step includes bending the first extension section and the first connection section in a direction perpendicular to an extending direction of the first signal transmission unit.

21. The display device assembly method of claim 17 further comprising:
superimposing a third electronic module on the first electronic module, wherein the third electronic module includes a third signal transmission unit;
superimposing a second connection section of the third signal transmission unit on a second extension section of the first signal transmission unit;
coupling the second extension section electrically with the second connection section; and
bending the second extension section and the second connection section to partly overlap the third signal transmission unit.

22. The display device assembly method of claim 21, wherein a combination of the first extension section and the first connection section and a combination of the second extension section and the second connection section are bent and disposed on two opposites sides of the first electronic module.

23. The display device assembly method of claim 21, wherein a combination of the first extension section and the first connection section and a combination of the second extension section and the second connection section are bent and disposed on one identical side of the first electronic module.

24. The display device assembly method of claim 17 further comprising:
disposing a frame to enwrap the first electronic module and the second electronic module; and
forming an opening on the frame to expose part of a combination of the first extension section and the first connection section.

25. The display device assembly method of claim 17 further comprising:
disposing a frame with electrical conductivity to enwrap the first electronic module and the second electronic module;

disposing a ground point on the first extension section or on the first connection section; and coupling the ground point electrically with the frame.

26. The display device assembly method of claim 17, wherein the coupling step includes using iron soldering, press-soldering or laser soldering to electrically couple the first extension section with the first connection section.

27. The display device of claim 1, wherein the first extension section and the first connection section are bent beneath the first electronic module.

28. The display device assembly method of claim 17, wherein the bending step includes bending the first extension section and the first connection section beneath the first electronic module.

29. A display device comprising:
- a first electronic module including a first signal transmission unit, wherein a side of the first signal transmission unit extends to form a first extension section;
- a second electronic module including a second signal transmission unit, wherein the second electronic module partly overlaps the first electronic module, the first signal transmission unit partly overlaps the second signal transmission unit; and
- a frame enwrapping the first electronic module and the second electronic module, wherein the frame has an opening corresponding to and exposing part of a combination of the first extension section and the first connection section;

wherein a side of the second signal transmission unit extends to form a first connection section, the first extension section and the first connection section are electrically coupled and together bent to partly overlap the second signal transmission unit.

30. A display device assembly method comprising:

superimposing a first electronic module on a second electronic module wherein the first electronic module includes a first signal transmission unit and the second electronic module includes a second signal transmission unit;

superimposing a first extension section of the first signal transmission unit on a first connection section of the second signal transmission unit;

coupling the first extension section electrically with the first connection section;

together bending the first extension section and the first connection section to partly overlap the second signal transmission unit;

disposing a frame to enwrap the first electronic module and the second electronic module; and forming an opening on the frame to expose part of a combination of the first extension section and the first connection section.

* * * * *